(12) United States Patent
Li et al.

(10) Patent No.: US 11,545,483 B2
(45) Date of Patent: Jan. 3, 2023

(54) NANOSHEET (NS) AND FIN FIELD-EFFECT TRANSISTOR (FINFET) HYBRID INTEGRATION

(71) Applicant: QUALCOMM Incorporated, San Diego, CA (US)

(72) Inventors: Xia Li, San Diego, CA (US); Haining Yang, San Diego, CA (US); Bin Yang, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 110 days.

(21) Appl. No.: 16/712,222

(22) Filed: Dec. 12, 2019

(65) Prior Publication Data

US 2021/0183852 A1    Jun. 17, 2021

(51) Int. Cl.
| | |
|---|---|
| H01L 27/06 | (2006.01) |
| H01L 29/04 | (2006.01) |
| H01L 29/06 | (2006.01) |
| H01L 29/66 | (2006.01) |
| H01L 21/8238 | (2006.01) |
| H01L 21/762 | (2006.01) |
| H01L 29/78 | (2006.01) |

(52) U.S. Cl.
CPC .... *H01L 27/0617* (2013.01); *H01L 21/76243* (2013.01); *H01L 21/823807* (2013.01); *H01L 21/823821* (2013.01); *H01L 21/823892* (2013.01); *H01L 29/045* (2013.01); *H01L 29/0665* (2013.01); *H01L 29/66795* (2013.01); *H01L 29/785* (2013.01)

(58) Field of Classification Search
CPC ....... H01L 29/66795; H01L 21/823821; H01L 29/785; H01L 27/1211; H01L 21/845; H01L 27/0886; H01L 29/42392; H01L 27/1207; H01L 29/42384; H01L 29/42312; H01L 29/42316; H01L 29/4232; H01L 29/42376; H01L 2029/42388; H01L 29/40; H01L 29/41
See application file for complete search history.

(56) References Cited

U.S. PATENT DOCUMENTS

| | | | |
|---|---|---|---|
| 2011/0254099 A1* | 10/2011 | Xiao | H01L 27/12 257/369 |
| 2013/0153997 A1* | 6/2013 | Chang | H01L 29/66439 257/334 |

OTHER PUBLICATIONS

Yang M., et al., "Hybrid-Orientation Technology (HOT): Opportunities and Challenges", IEEE Transactions on Electron Devices, May 2006, vol. 53, No. 5, pp. 965-978.

* cited by examiner

*Primary Examiner* — Julio J Maldonado
*Assistant Examiner* — Stanetta D Isaac
(74) *Attorney, Agent, or Firm* — Patterson + Sheridan, L.L.P.

(57) ABSTRACT

Certain aspects of the present disclosure are directed to a semiconductor device. The semiconductor device generally includes a substrate, at least one silicon-on-insulator (SOI) transistor disposed above the substrate, a gate-all-around (GAA) transistor disposed above the substrate, and a fin field-effect transistor (FinFET) disposed above the substrate.

14 Claims, 8 Drawing Sheets

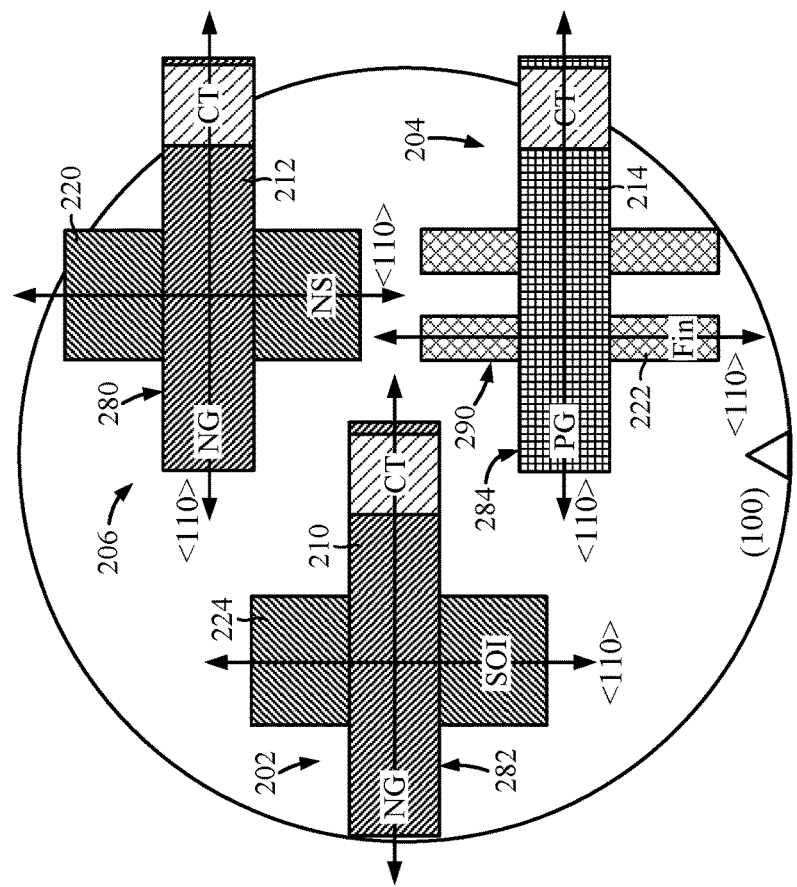
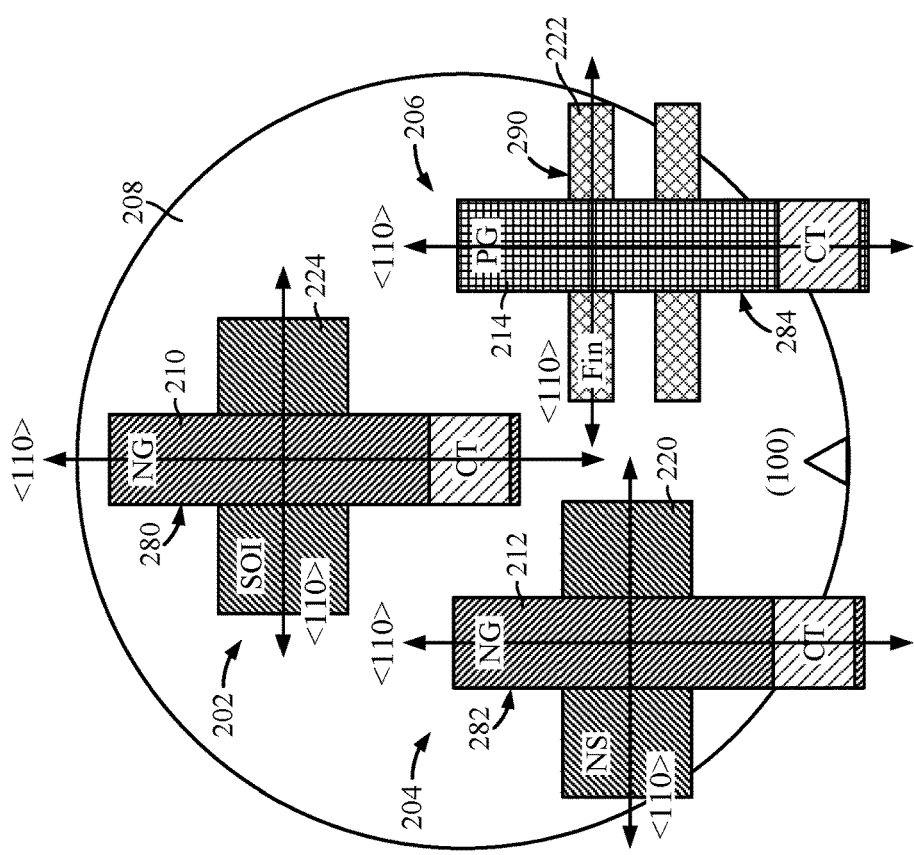
FIG. 2A
FIG. 2B

NANOSHEET (NS) AND FIN FIELD-EFFECT TRANSISTOR (FINFET) HYBRID INTEGRATION

TECHNICAL FIELD

Certain aspects of the present disclosure generally relate to electronic components and, more particularly, to a semiconductor device.

BACKGROUND

Transistors are essential components in modern electronic devices. Large numbers of transistors are employed in integrated circuits (ICs) in many modern electronic devices. For example, components such as central processing units (CPUs) and memory systems each employ a large quantity of transistors for logic circuits and memory devices.

As electronic devices become more complex in functionality, so does the need to include a greater number of transistors in such devices. However, as electronic devices are provided in increasingly smaller packages, such as in mobile devices, for example, a greater number of transistors may be provided in a smaller IC chip. This increase in the number of transistors is achieved in part through continued efforts to miniaturize transistors in ICs. As a result, the gate lengths of transistors are reduced, thereby reducing the channel length of the transistors and interconnects. Reduced channel length in transistors has the benefit of increasing drive strength and providing smaller parasitic capacitances resulting in reduced circuit delay. However, as channel length in transistors is reduced, short channel effects (SCEs) can occur that degrade performance. More specifically, SCEs in transistors cause increased current leakage, reduced threshold voltage, and/or threshold voltage roll-off.

In this regard, to address the desire to scale down channel lengths in transistors while avoiding or mitigating SCEs, transistor design alternatives have been developed. One such alternative transistor design includes a fin field-effect transistor (FinFET) that provides a conducting channel via a fin formed from a substrate. Material is wrapped around the fin to form the gate of the device. The FinFET includes a source and a drain interconnected by the fin such that an interior portion of the fin serves as a conduction channel between the source and drain. The fin is surrounded by a gate, and thus, the gate provides better electrostatic control over the channel and consequently helps reduce the leakage current and overcome SCEs.

SUMMARY

Certain aspects of the present disclosure are directed to a semiconductor device. The semiconductor device generally includes a substrate, at least one silicon-on-insulator (SOI) transistor disposed above the substrate, a gate-all-around (GAA) transistor disposed above the substrate, and a fin field-effect transistor (FinFET) disposed above the substrate.

Certain aspects of the present disclosure are directed to a method for fabricating a semiconductor device. The method generally includes forming at least one SOI transistor above a substrate, forming a GAA transistor above the substrate, and forming a FinFET above the substrate.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIGS. 2A and 2B illustrate orientations of a silicon-on-insulator (SOI) transistor, a p-type fin field-effect transistor (FinFET), and an n-type gate-all-around transistor on a wafer, in accordance with certain aspects of the present disclosure.

DETAILED DESCRIPTION

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Transistor

Certain aspects of the present disclosure are directed to improving n-type metal-oxide-semiconductor (NMOS) and p-type metal-oxide-semiconductor (PMOS) mobility and drive current for fin field-effect transistor (Fin-FET) and nanosheet (NS) gate-all-around (GAA) implementations. For fifth-generation (5G) millimeter wave (mmWave), and potentially, sixth-generation (6G) applications, more and more digital components are being added into radio-frequency (RF) chips. Integration of digital and RF components allows for higher performance and lower power applications. Certain aspects of the present disclosure are directed to silicon-on-insulator (SOI) RF complementary metal-oxide-semiconductor (CMOS) integrated with NS GAA and FinFET devices to enhance performance and allow for higher frequency and lower power applications in a small form factor.

Figure 1A:
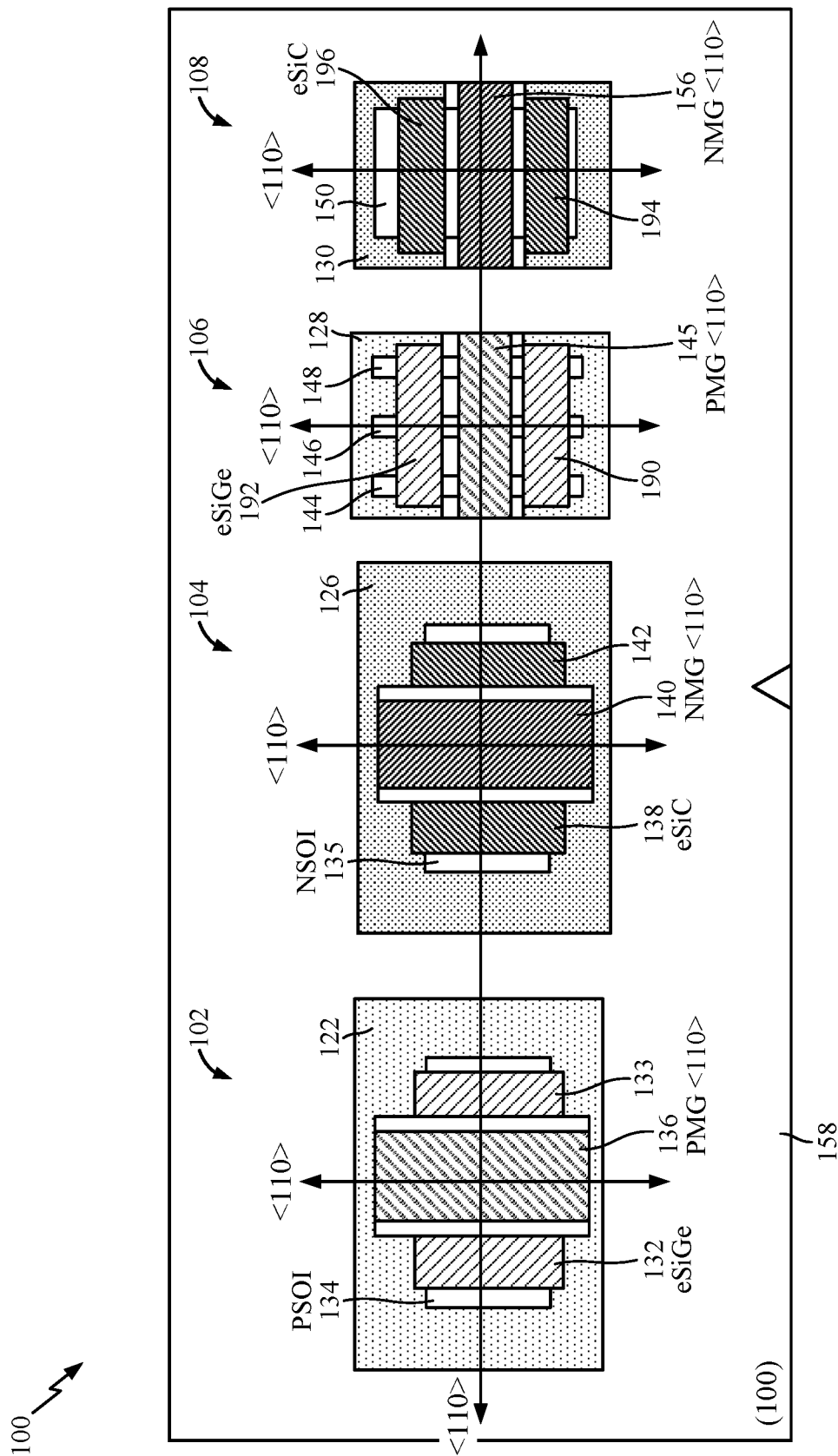
FIGS. 1A and 1B illustrate a top view and cross-sectional view, respectively, of a semiconductor device, in accordance with certain aspects of the present disclosure.
Figure 1B:
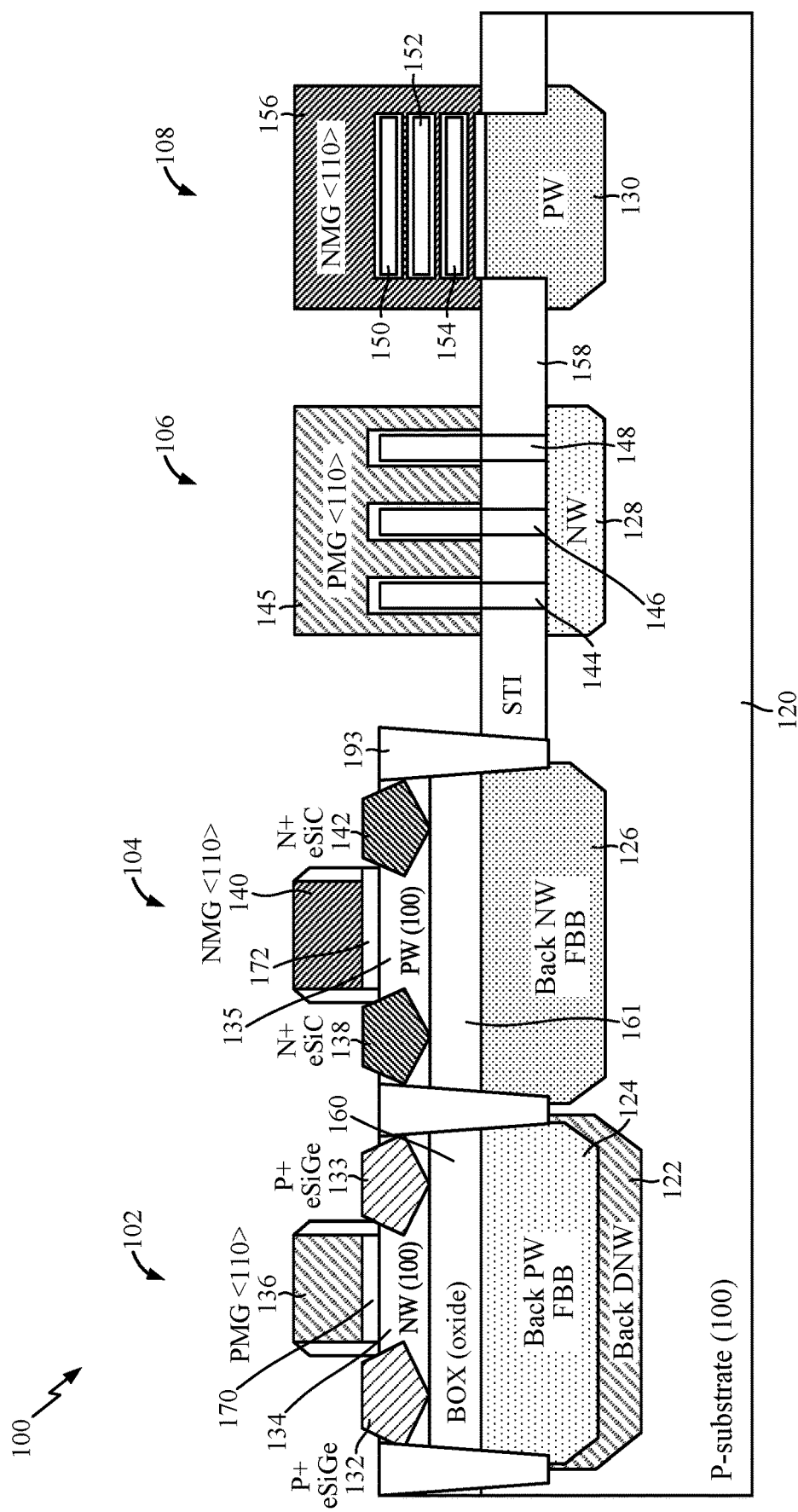

FIGS. 1A and 1B illustrate a top view and cross-sectional view, respectively, of a semiconductor device 100, in accordance with certain aspects of the present disclosure. As illustrated, the semiconductor device includes a SOI PMOS transistor 102, a SOI NMOS transistor 104, a p-type FinFET 106, and an n-type GAA FET 108, formed above a substrate 120. In other words, the SOI PMOS transistor 102, the SOI NMOS transistor 104, the p-type FinFET 106, and the n-type GAA FET 108 may be fabricated at the wafer level on a monolithic substrate (e.g., substrate 120). The SOI PMOS transistor 102 comprises a backside deep n-well (DNW) 122 and backside p-well (PW) 124 for forward body bias (FBB), which may be below a buried oxide (BOX) region 160. As illustrated, the PMOS transistor 102 includes semiconductor regions 132, 133 (e.g., source and drain regions) which are formed adjacent to a channel region 134 (e.g., n-well (NW) region). The semiconductor regions 132, 133 may be implemented using P+ embedded silicon germanium (eSiGe). A gate oxide 170 and a gate region 136 may be formed above the channel region 134, as illustrated.

The NMOS transistor 104 includes a back NW region 126 below the BOX region 161. The NMOS transistor 104 also includes semiconductor regions 138, 142 (e.g., drain and source regions) which are formed adjacent to a channel region 135 (e.g., PW region). A gate oxide 172 and a gate region 140 may be formed over the channel region 135, as illustrated.

The FinFET 106 includes fins 144, 146, 148 formed over an NW region 128. A gate region (e.g., p-type metal gate (PMG)) 145 may be formed adjacent to (e.g., above and surrounding lateral surfaces of a portion of each of) the fins 144, 146, 148, as illustrated. As illustrated in FIG. 1A, semiconductor regions 190, 192 (e.g., source and drain regions) may be formed adjacent to the fins 144, 146, 148.

The GAA FET 108 includes a PW region 130, over which slabs 150, 152, 154 (e.g., channels) may be formed. A slab of a GAA FET may also be referred to as a nanosheet. A gate region 156 (e.g., n-type metal gate (NMG)) is formed adjacent to (e.g., around) the slabs 150, 152, 154. As illustrated in FIG. 1A, semiconductor regions 194, 196 (e.g., drain and source regions) may be formed adjacent to the slabs 150, 152, 154.

As illustrated, an oxide 158 may be formed around the SOI PMOS transistor 102, SOI NMOS transistor 104, p-type FinFET 106, and n-type NS GAA FET 108. As illustrated, shallow trench isolation (STI) regions (e.g., STI 193) are disposed between the NMOS transistor 104 and the FinFET 106, as well as between the NMOS transistor 104 and the PMOS transistor 102.

FIGS. 2A and 2B illustrate orientations of an SOI transistor 202 (e.g., corresponding to SOI NMOS transistor 104), a p-type FinFET 206 (e.g., corresponding to p-type FinFET 106), and an n-type GAA FET 204 (e.g., corresponding to n-type NS GAA FET 108) on a wafer 208, in accordance with certain aspects of the present disclosure. Wafers are grown on crystals that have a regular lattice structure. When the wafers are sliced from the crystal ingot, the surface is aligned in one of several relative directions, known as the orientation. For example, the orientation of a crystal plane in a lattice may be specified by Miller Indices.

In certain aspects, sidewalls 280, 282, 284 of the gate regions 210, 212, 214 of the SOI transistor 202, the FinFET 206, and the GAA FET 204, respectively, are formed as a <110> orientation crystal plane. A top surface of the channel 224, a top of surface of the slab 220, and a sidewall 290 of the fin 222 of the SOI transistor 202, the FinFET 206, and the GAA FET 204, respectively, are formed as a <110> orientation crystal plane. The orientations of the p-type FinFET 206 and the n-type GAA FET 204, as described herein, increase the electron mobility of the p-type FinFET 206 and the n-type FET 204, improving device performance.

Figure 3A:
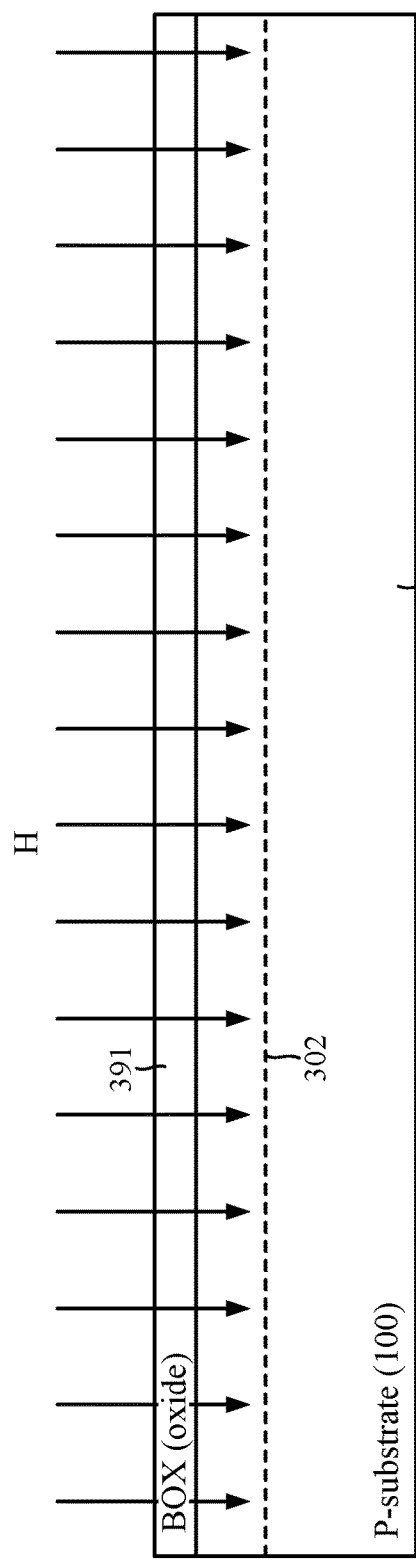
FIGS. 3A-3G illustrate techniques for fabricating the semiconductor device of FIGS. 1A and 1B, in accordance with certain aspects of the present disclosure.
Figure 3B:
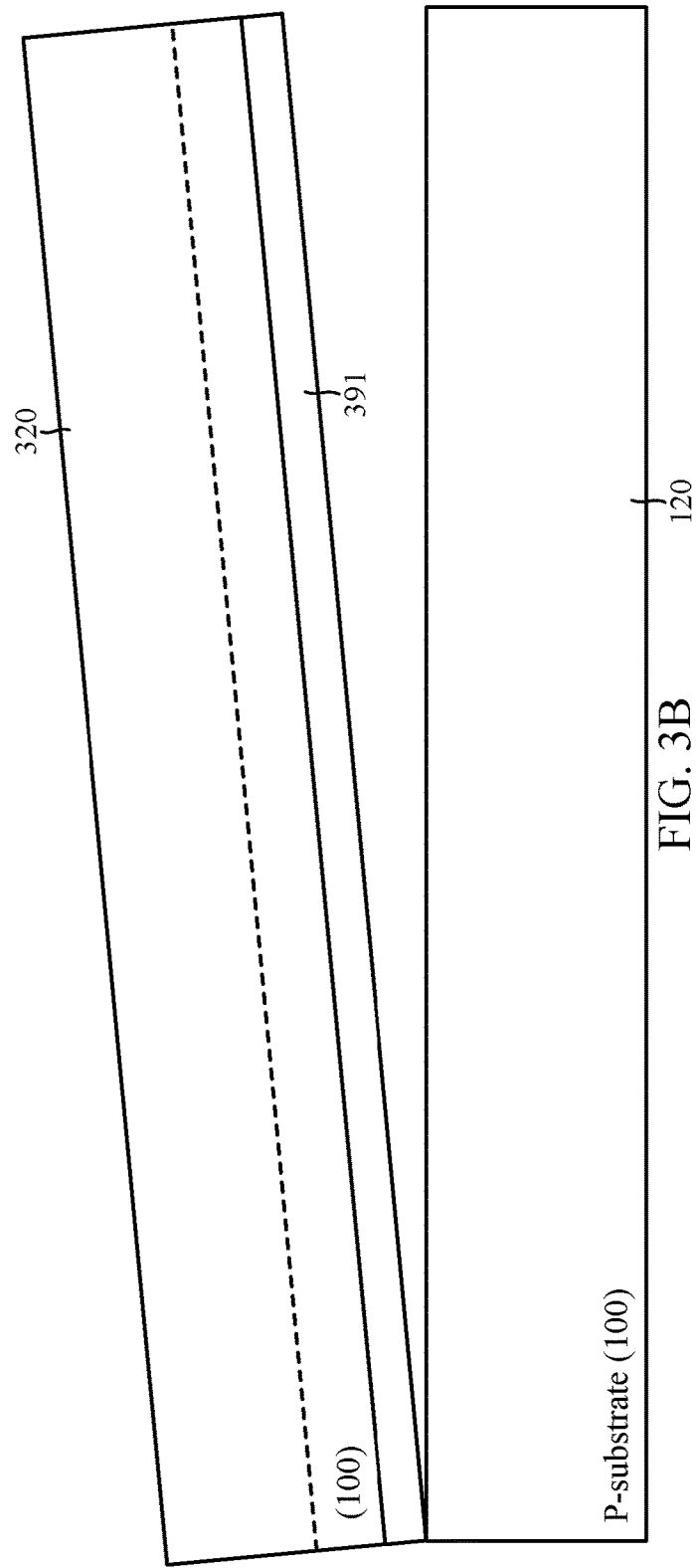

FIGS. 3A-3G illustrate techniques for fabricating the semiconductor device 100, in accordance with certain aspects of the present disclosure. As illustrated in FIG. 3A, the BOX region 391 (e.g., corresponding to BOX regions 160, 161) may be formed above a substrate 320. A hydrogen (H) implant operation may then be performed to form a disbond line 302 in the substrate 320. As illustrated in FIG. 3B, the substrate 320 and the BOX region 391 (e.g., H disbond implant wafer) are flipped and bonded onto the substrate 120 (e.g., handle wafer).

Figure 3C:
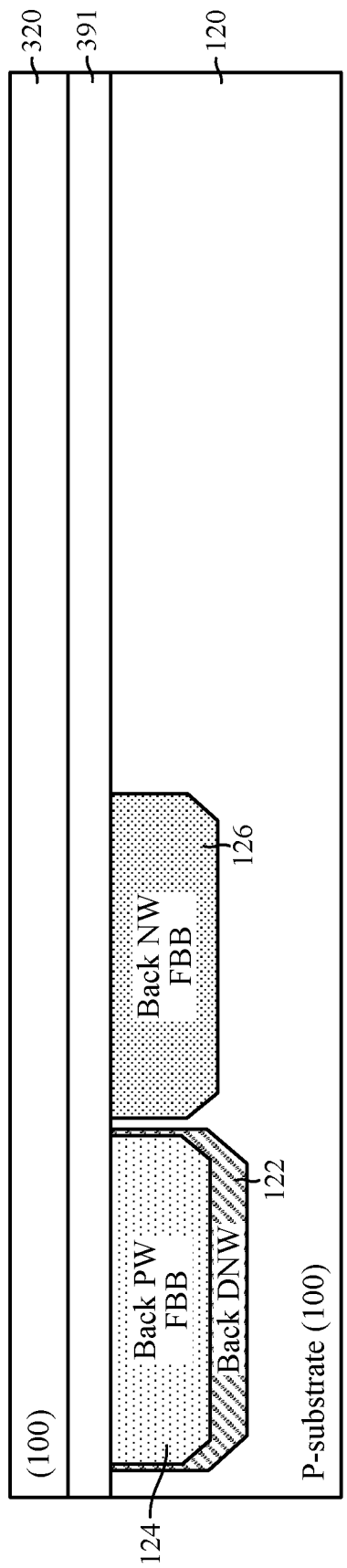

As illustrated in FIG. 3C, wafer split annealing is performed to separate the H disbond implant wafer at the disbond line 302, and the upper portion above the disbond line may be removed. Bond annealing may be performed to strengthen the bond between the BOX region 391 and the substrate 120, followed by chemical-mechanical polishing (CMP) and SOI thinning to form the SOI wafer. Photo patterning, followed by DNW, NW, PW implantation is performed to form the back wells (e.g., DNW 122, PW 124, and NW 126) for the SOI devices (e.g., SOI PMOS transistor 102, SOI NMOS transistor 104).

Figure 3D:
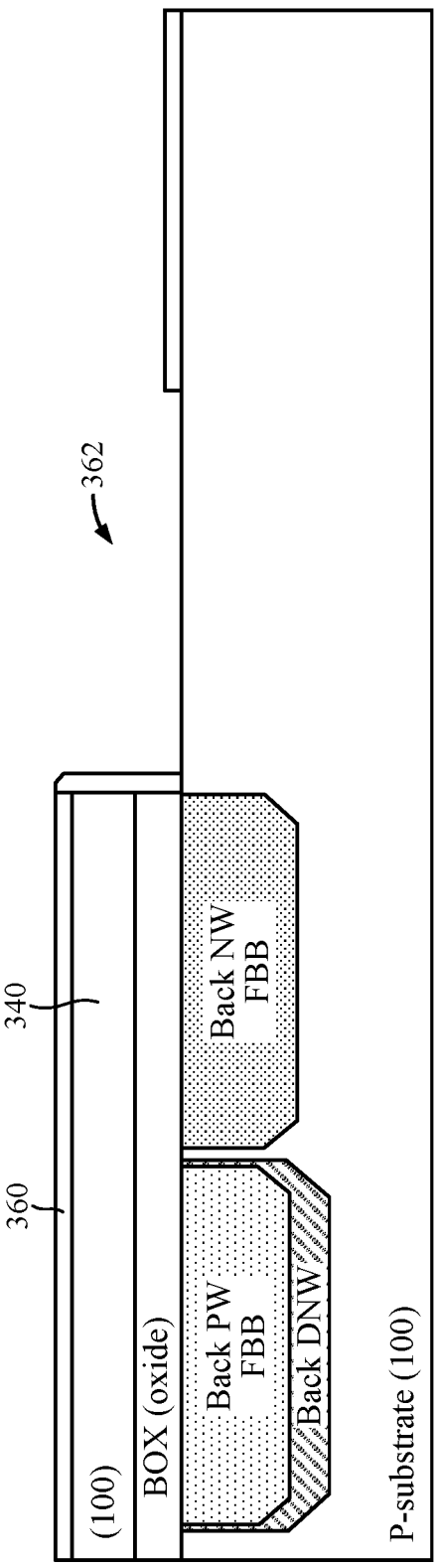
Figure 3E:
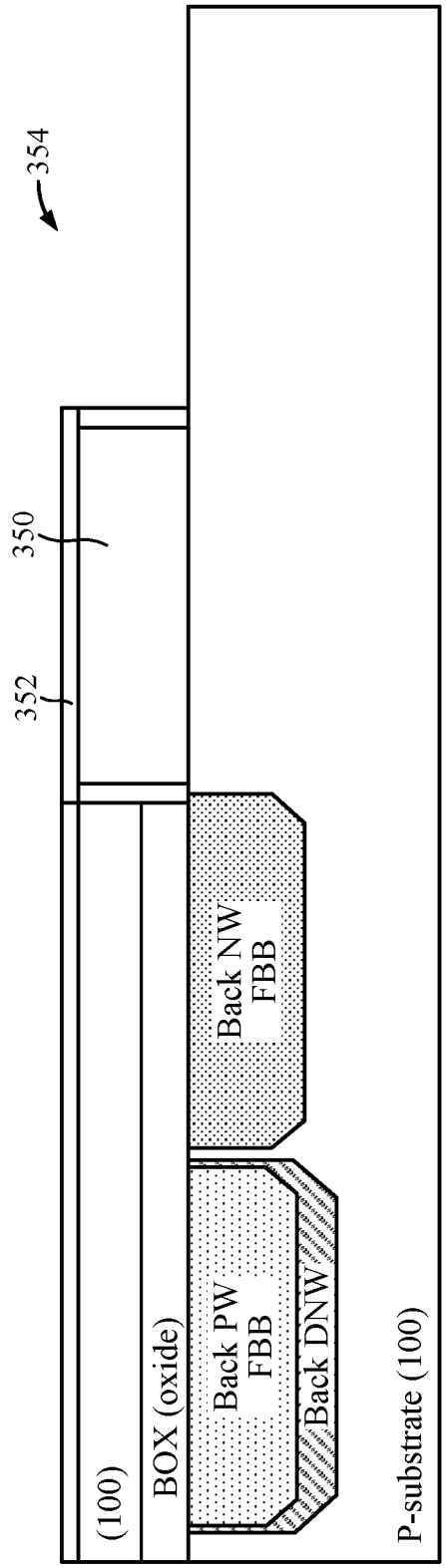
Figure 3F:
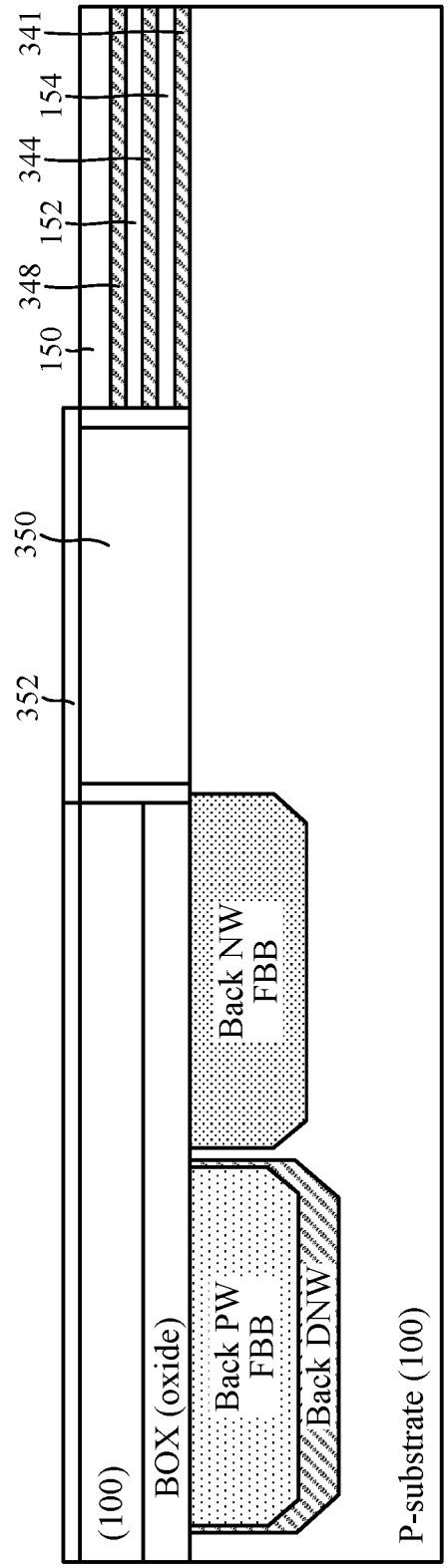
Figure 3G:
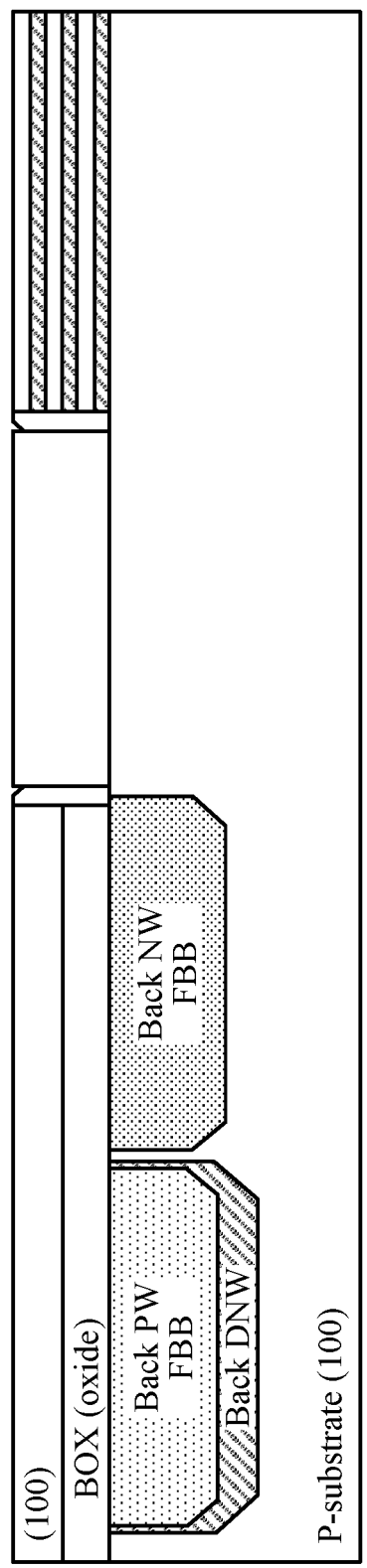

As illustrated in FIG. 3D, SOI silicon and BOX patterning and etching is performed to form semiconductor region 340 (e.g., for formation of channel regions of SOI devices), followed by deposition of oxide 360 (e.g., for formation of gate oxides 170, 172) and patterning of the oxide 360 to open FinFET area 362. As illustrated in FIG. 3E, silicon 350 is formed using an epitaxial growth process, followed by deposition of oxide 352 and oxide patterning to open the NS GAA FET area 354. As illustrated in FIG. 3F, epitaxy is used to form SiGe region 341, the slab 154 (e.g., Si), SiGe region 344, the slab 152, SiGe 348, and the slab 150, for the NS GAA FET 108. As illustrated in FIG. 3G, the top regions of the oxides 352, 360 are removed, followed by touch-up polishing. Fin and NS patterning is then performed, followed by formation of STI regions (e.g., STI 193), FinFET and NS NW and PW photo patterning and implantation using separate processes, and formation of SOI, FinFET (e.g., p-type FinFET 106), and NS device (e.g., NS GAA FET 108), to form the semiconductor device 100 illustrated in FIGS. 1A and 1B.

Figure 4:
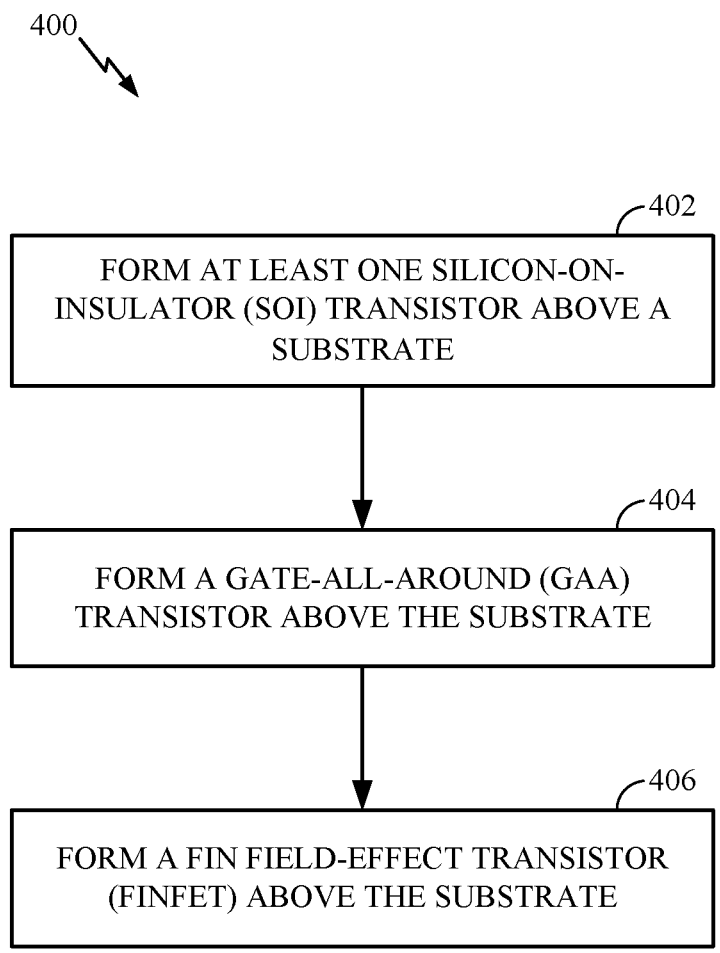
FIG. 4 is a flow diagram illustrating example operations for fabricating a semiconductor device, in accordance with certain aspects of the present disclosure.

FIG. 4 is a flow diagram illustrating example operations 400 for fabricating a semiconductor device, in accordance with certain aspects of the present disclosure. The operations 400 may be performed by a semiconductor fabrication chamber, for example.

The operations 400 begin, at block 402, with the chamber forming at least one SOI transistor (e.g., SOI PMOS transistor 102 or SOI NMOS transistor 104) above a substrate (e.g., wafer-level substrate 120), and at block 404, forming a GAA transistor (e.g., GAA FET 108) above the substrate. At block 406, the chamber forms a FinFET (e.g., FinFET 106) above the substrate. In certain aspects, the at least one SOI transistor comprises a PMOS transistor and an NMOS transistor, the NMOS transistor and the PMOS transistor forming a CMOS device. In certain aspects, the GAA transistor comprises an n-type GAA transistor, and the FinFET comprises a p-type FinFET.

In certain aspects, the substrate is a (100) crystal plane substrate, a top surface of a channel (e.g., channel region 134 or channel region 135) of the at least one SOI transistor is formed as a (100) orientation crystal plane, a sidewall (e.g., sidewall 290) of a fin of the FinFET is formed at a <110> orientation crystal plane, and a top surface of a slab of the GAA transistor is formed as a (100) orientation crystal plane. In certain aspects, a sidewall (e.g., sidewall 282) of at least one gate region of the at least one SOI transistor is formed as a <110> orientation crystal plane, a sidewall (e.g., sidewall 284) of a gate region of the FinFET is formed as a <110> orientation crystal plane, and a sidewall (e.g., sidewall 280) of a gate region of the GAA transistor is formed as a <110> orientation crystal plane.

In certain aspects, forming the at least one SOI transistor comprises forming an oxide region (e.g., BOX region 160) above another substrate, flipping the oxide region and the other substrate above the substrate such that the oxide region is adjacent to and above the substrate, removing a portion of the other substrate to form a channel region (e.g., channel region 134 or channel region 135) of the at least one SOI transistor above the oxide region, forming a well region (e.g., PW 124 or NW 126) below the oxide region, forming a gate oxide (e.g., gate oxide 170 or gate oxide 172) above the channel region, and forming a gate region (e.g., gate region 136 or gate region 140) above the gate oxide. In certain aspects, forming the FinFET includes forming a well region (e.g., NW region 128) above the substrate, forming at least one fin (e.g., fins 144, 146, 148) above the well region, and forming a gate region (e.g., gate region 145) adjacent to the at least one fin. In certain aspects, forming the GAA transistor comprises forming one or more slabs (e.g., slabs 150, 152, 154) above the substrate, forming a well region (e.g., PW region 130) below the one or more slabs, and forming a gate region (e.g., gate region 156) adjacent to the one or more slabs. In some cases, the gate region is formed around each of the one or more slabs. In certain aspects, the operations 400 also include forming a shallow trench isolation region (e.g., STI 193) between the FinFET and the at least one SOI transistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A semiconductor device comprising:
   a substrate;
   at least one silicon-on-insulator (SOI) transistor disposed above the substrate;
   a gate-all-around (GAA) transistor disposed above the substrate; and
   a fin field-effect transistor (FinFET) disposed above the substrate.

2. The semiconductor device of claim 1, wherein the at least one SOI transistor comprises:
   a p-type metal-oxide-semiconductor (PMOS) transistor; and
   an n-type metal-oxide-semiconductor (NMOS) transistor, the NMOS transistor and the PMOS transistor forming a complementary metal-oxide-semiconductor (CMOS) device.

3. The semiconductor device of claim 1, wherein the GAA transistor comprises an n-type GAA transistor, and wherein the FinFET comprises a p-type FinFET.

4. The semiconductor device of claim 1, wherein:
   the substrate is a (100) crystal plane substrate;
   a top surface of a channel of the at least one SOI transistor has a (100) orientation crystal plane;
   a sidewall of a fin of the FinFET has a <110> orientation crystal plane; and
   a top surface of a slab of the GAA transistor has a (100) orientation crystal plane.

5. The semiconductor device of claim 4, wherein:
   a sidewall of at least one gate region of the at least one SOI transistor has a <110> orientation crystal plane;
   a sidewall of a gate region of the FinFET has a <110> orientation crystal plane; and a sidewall of a gate region of the GAA transistor has a <110> orientation crystal plane.

6. The semiconductor device of claim 1, wherein the at least one SOI transistor comprises:
a well region disposed above the substrate;
an oxide region disposed above the well region;
a channel region disposed above the oxide region;
a gate oxide disposed above the channel region; and
a gate region disposed above the gate oxide.

7. The semiconductor device of claim 1, wherein the FinFET comprises:
a well region disposed above the substrate;
at least one fin disposed above the well region; and
a gate region disposed adjacent to the at least one fin.

8. The semiconductor device of claim 1, wherein the GAA transistor comprises:
a well region disposed above the substrate;
one or more slabs disposed above the well region; and
a gate region disposed adjacent to the one or more slabs.

9. The semiconductor device of claim 8, wherein the gate region is disposed around each of the one or more slabs.

10. The semiconductor device of claim 1, further comprising:
a shallow trench isolation region disposed between the FinFET and the at least one SOI transistor.

11. The semiconductor device of claim 1, wherein:
the SOI transistor is laterally spaced apart from the FinFET; and
the FinFET is laterally spaced apart from the GAA transistor.

12. The semiconductor device of claim 1, wherein the SOI transistor, the FinFET, and the GAA transistor are collinear.

13. The semiconductor device of claim 1, wherein:
the GAA transistor is a first distance from the SOI transistor;
the GAA transistor is a second distance from the FinFET; and
the first distance is greater than the second distance.

14. The semiconductor device of claim 1, wherein a top of the SOI transistor, a top of the FinFET, and a top of the GAA transistor are substantially a same distance from the substrate.

* * * * *